United States Patent
Nongaillard et al.

(10) Patent No.: US 12,513,932 B2
(45) Date of Patent: Dec. 30, 2025

(54) ELECTRONIC DEVICE COMPRISING TWO HIGH ELECTRON MOBILITY TRANSISTORS

(71) Applicants: STMicroelectronics France, Montrouge (FR); STMicroelectronics International N.V., Geneva (CH)

(72) Inventors: Matthieu Nongaillard, Grenoble (FR); Thomas Oheix, Grenoble (FR)

(73) Assignee: STMicroelectronics France, Montrouge (FR)

( * ) Notice: Subject to any disclaimer, the term of this patent is extended or adjusted under 35 U.S.C. 154(b) by 592 days.

(21) Appl. No.: 17/705,025

(22) Filed: Mar. 25, 2022

(65) Prior Publication Data

US 2022/0320325 A1 Oct. 6, 2022

(30) Foreign Application Priority Data

Mar. 30, 2021 (FR) ...................... 2103238

(51) Int. Cl.
  H10D 30/47 (2025.01)
  H10D 62/85 (2025.01)
(52) U.S. Cl.
  CPC ......... *H10D 30/47* (2025.01); *H10D 62/8503* (2025.01)
(58) Field of Classification Search
  CPC ... H01L 29/122–127; H01L 29/15–158; H01L 29/66431; H01L 29/66462; H01L 29/778–7789; H01L 2924/13064; H01L 25/04–0756; H01L 25/117; H01L 2225/06503–06596; H10D 30/015; H10D 30/47–478
  See application file for complete search history.

(56) References Cited

U.S. PATENT DOCUMENTS

| | | |
|---|---|---|
| 2009/0167411 A1 | 7/2009 | Machida et al. |
| 2009/0206363 A1* | 8/2009 | Machida ............. H01L 29/7787 257/133 |
| 2011/0095358 A1 | 4/2011 | Micciche' et al. |

(Continued)

FOREIGN PATENT DOCUMENTS

| | | |
|---|---|---|
| EP | 2731132 A2 | 5/2014 |
| EP | 3293758 A1 | 3/2018 |

OTHER PUBLICATIONS

Jones et al., "Application-Based Review of GaN HFETs," 2014 IEEE Workshop on Wide Bandgap Power Devices and Applications, Oct. 2014, pp. 24-29.

(Continued)

*Primary Examiner* — Julio J Maldonado
*Assistant Examiner* — Eric Manuel Mulero Flores
(74) *Attorney, Agent, or Firm* — Seed Intellectual Property Law Group LLP (57) ABSTRACT

The disclosure concerns an electronic device comprising a HEMT transistor, called main transistor, and at least another HEMT transistor, called additional transistor, stacked on each other. The main transistor and the additional transistor comprise a common drain electrode and, respectively, a main source electrode and an additional source electrode, arranged so that electric conduction paths likely to be formed by the two conduction layers are connected in parallel when one and the other of the HEMT transistors are in the conductive state.

20 Claims, 6 Drawing Sheets

(56) References Cited

U.S. PATENT DOCUMENTS

| | | |
|---|---|---|
| 2012/0256189 A1 | 10/2012 | McDonald et al. |
| 2013/0234207 A1 | 9/2013 | Choi et al. |
| 2013/0320354 A1* | 12/2013 | Treu .................. H01L 23/49575 257/76 |
| 2014/0091366 A1* | 4/2014 | Jeon ...................... H10D 88/101 257/195 |
| 2014/0131887 A1 | 5/2014 | Lee et al. |
| 2014/0266324 A1* | 9/2014 | Teo ...................... H01L 29/7831 327/109 |
| 2015/0014698 A1* | 1/2015 | Briere .................. H03K 17/223 257/76 |
| 2015/0048420 A1* | 2/2015 | Leomant .............. H10D 30/475 257/194 |
| 2015/0069615 A1 | 3/2015 | Ohno et al. |
| 2015/0279670 A1* | 10/2015 | Cho .................... H01L 29/7869 257/43 |
| 2017/0040312 A1* | 2/2017 | Curatola ........... H01L 29/66143 |
| 2021/0296452 A1* | 9/2021 | Hanson ................ H01L 29/7786 |
| 2021/0376135 A1* | 12/2021 | Kwan ................. H01L 27/0605 |
| 2022/0336651 A1 | 10/2022 | Nongaillard et al. |
| 2022/0359714 A1 | 11/2022 | Nongaillard et al. |

OTHER PUBLICATIONS

Shi et al., "A High-Performance GaN E-mode Reverse Blocking MISHEMT with MIS Field Effect Drain for Bidirectional Switch," *Proceedings of The 29th International Symposium on Power Semiconductor Devices & ICs*, Sapporo, Japan, May 28, 2017, pp. 207-210.

Wen et al., "A Dual-Mode Driver IC With Monolithic Negative Drive-Voltage Capability and Digital Current-Mode Controller for Depletion-Mode GaN HEMT," *IEEE Transactions on Power Electronics* 32(1): 423-432, Jan. 2017.

U.S. Appl. No. 17/711,597, filed Apr. 1, 2022.
U.S. Appl. No. 17/736,767, filed May 4, 2022.

* cited by examiner

ELECTRONIC DEVICE COMPRISING TWO HIGH ELECTRON MOBILITY TRANSISTORS

CROSS-REFERENCE TO RELATED APPLICATION(S)

This application claims the priority benefit of French patent application number FR2103238, filed on Mar. 30, 2021, entitled "ELECTRONIC DEVICE COMPRISING TWO HIGH ELECTRON MOBILITY TRANSISTORS," which is hereby incorporated by reference to the maximum extent allowable by law."

BACKGROUND

Technical Field

The disclosure relates to the field of electronics, and more particularly of power electronics. More particularly, the present disclosure concerns an electronic device provided with two high electron mobility transistors.

Description of the Related Art

High electron mobility transistors ("HEMT"), well known by those skilled in the art, are now widely implemented in the field of hyperfrequencies and that of switches for power electronics converters.

In this regard, HEMT transistors are generally elaborated from layers of III-V semiconductor materials and more particularly III-N semiconductor materials.

BRIEF SUMMARY

The device according to the present disclosure is arranged to allow a better integration of the two high electron mobility transistors.

The arrangement provided in the present disclosure enables in this regard to obtain a compact device enabling to increase the density of current likely to flow through said device with respect to a single high electron mobility transistor.

The embodiments include an electronic device comprising an HEMT transistor, called main transistor, and at least another HEMT transistor, called additional transistor, the main transistor and the additional transistor being provided, respectively, with a main stack and with an additional stack having an insulating layer interposed therebetween, the main stack and the additional stack extending, from the insulating layer towards, respectively, a back side and a front side of the electronic device, and each comprising, from the insulating layer, a barrier layer and a channel layer which, when the considered HEMT transistor switches from a non-conductive state to a conductive state, is capable of forming a conduction layer, the main transistor and the additional transistor comprising a common drain electrode and, respectively, a main source electrode and an additional source electrode, arranged so that electric conduction paths likely to be formed by the two conduction layers are connected in parallel when one and the other of the HEMT transistors are in the conductive state, the switching from one of the non-conductive state and of the conductive state to the other one of these two states being controlled independently for one and the other of the main transistor and of the additional transistor via, respectively, a main gate electrode and an additional gate electrode.

Thus, according to the present disclosure, it is possible to increase the density of high electron mobility transistors without for all this increasing the surface area occupied by the electronic device.

Further, the parallel arrangement of the conduction layers of the two transistors enables to increase the current likely to flow through the electronic device and thus to open the way to higher power applications. Thus, according to the present disclosure, as soon as the current flowing through the main transistor exceeds a threshold value, it is possible to make the additional transistor conductive.

Further, the electronic device according to the present disclosure requires no resizing of the high electron mobility transistors that it comprises.

Further, the parallel connection of the conduction paths enables to limit the resistivity Ron of the electronic device.

According to an embodiment, the drain electrode crosses the insulating layer and extends on either side of said insulating layer to electrically contact the channel layer of one and the other of the main transistor and of the additional transistor, in some implementations, the electronic device comprises a pad, called drain pad, arranged on the back side and enabling to electrically contact the drain electrode.

According to an embodiment, said electric device comprises a pad, called main gate pad, arranged on the back side and enabling to electrically contact the main gate electrode and a pad, called additional gate pad, arranged on the front side and enabling to electrically contact the additional gate electrode.

According to an embodiment, the main transistor and the additional transistors are enhancement-mode HEMT transistors, and the main source electrode and the additional source electrode form a single source electrode, in some implementations, the source electrode crosses the insulating layer, and extends on either side of said insulating layer to electrically contact the channel layer of one and the other of the main transistor and of the additional transistor.

According to an embodiment, said electronic device comprises a pad called source pad enabling to electrically contact the source electrode.

According to an embodiment, the source pad is arranged on the front side.

According to an embodiment, the main transistor and the additional transistor are depletion-mode HEMT transistors, and are each cascoded with a MOSFET transistor respectively called main MOSFET transistor and additional MOSFET transistor.

According to an embodiment, the main MOSFET transistor and the additional MOSFET transistor are arranged to impose, independently, a conductive state or a non-conductive state, respectively, to the main transistor and to the additional transistor.

According to an embodiment, said electronic device further comprises two pads called main source pad and additional source pad enabling to electrically contact, respectively, the main source electrode and the additional source electrode, the main source pad and the additional source pad being arranged, respectively, on the back side and on the front side.

According to an embodiment, the main stack and the additional stack are essentially identical.

According to an embodiment, the main transistor and the additional transistor have an identical threshold voltage.

According to an embodiment, the main transistor and the additional transistor each respectively have a main threshold voltage and an additional threshold voltage different from each other.

According to an embodiment, the two channel layers comprise GaN and the barrier layers comprise a ternary AlGaN alloy.

According to an embodiment, the insulating layer comprises a dielectric material, in some implementations silicon dioxide.

The implementation of the insulating layer is particularly advantageous, since it enables to efficiently insulate the two barrier layers.

Considering this insulating layer also simplifies the assembly of the two high-mobility transistors. Indeed, the latter enables to consider an assembly by molecular bonding of the two transistors.

The disclosure also concerns an electronic package comprising:
the electronic device according to the present disclosure;
means for controlling the switching from one of the non-conductive state and from the conductive state to the other one of these two states, of the main transistor and of the additional transistor, the control means being configured to make the additional transistor conductive as soon as the main transistor is itself in the conductive state and as the current that it conducts is greater than a threshold value.

BRIEF DESCRIPTION OF THE SEVERAL VIEWS OF THE DRAWINGS

Other features and advantages of the disclosure will appear from the following detailed description in relation with the appended drawings, in which:

FIG. 2B is a representation illustrating the offset positioning of the main gate pad and of the additional gate pad enabling to electrically connect the main gate electrode and the additional gate electrode of the electronic device of FIG. 2a;

DETAILED DESCRIPTION

Figure 1:
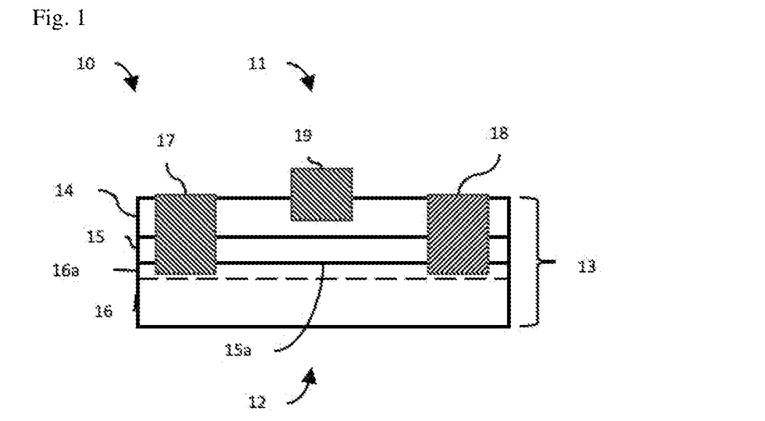
FIG. 1 is a simplified representation of a known HEMT transistor of the state of the art, particularly the HEMT transistor is shown along a cross-section plane perpendicular to the front side.

FIG. 1 shows a HEMT transistor 10. This HEMT transistor 10 is provided with a stack 13 which comprises, from a front side 11 to a back side 12, an insulator layer 14, a barrier layer 15, and a channel layer 16 capable of forming a conduction layer 16a in the form of a two-dimensional electron gas layer. In some implementations, conduction layer 16a extends in channel layer 16 from an interface 15a, formed between barrier layer 15 and said channel layer 16.

The III-V semiconductor materials selected to form barrier layer 15 and/or channel layer 16 may comprise gallium nitride (GaN), aluminum nitride (AlN), $Al_xGa_{1-x}N_x$ ternary alloys, gallium arsenide (GaAs), AlGaAs or InGaAs ternary alloys. For example, barrier layer 15 and channel layer 16 may respectively comprise an AlaGaN compound and GaN. Insulator layer 14 may comprise a dielectric material, and particularly silicon dioxide ($SiO_2$) or silicon nitride ($Si_3N_4$).

HEMT transistor 10 also comprises a source electrode 17 and a drain electrode 18 in electric contact with conduction layer 16a. More particularly, source electrode 17 and drain electrode 18 emerge through front side 11, and cross barrier layer 15 to reach interface 15a and electrically contact conduction layer 16a. Source electrode 17 and drain electrode 18 may partially or integrally cross conduction layer 16a. Source electrode 17 and drain electrode 18 may comprise a metal species, for example, aluminum, filling trenches formed in stack 13.

HEMT transistor 10 also comprises a gate electrode 19 intended to be imposed a voltage V enabling to control the state of conduction layer 16a. Particularly, as soon as the electric potential difference between gate electrode 19 and source electrode 17, noted Vg–Vs, is greater than a threshold voltage Vth characteristic of HEMT transistor 10, said transistor is in the conductive state. Conversely, as soon as Vg–Vs is smaller than Vth, HEMT transistor 10 is in the non-conductive state, and thus behaves as an off switch.

Thus, depending on the value of threshold voltage Vth, and more particularly on its sign, a HEMT transistor may be in depletion (normally-on) mode if its threshold voltage Vth is negative, or in enhancement (normally-off) mode if its threshold voltage Vth is positive.

Such a high electron mobility transistor however has an on-state resistivity Ron (Ron being the on-state drain/source resistance) which limits the intensity of the current likely to flow through the conduction layer.

In this regard, the main parameters influencing resistivity Ron are:
the surface resistance of the channel layer;
the resistance of the contacts between the conduction layer and the source and drain electrodes;
the electric resistivities of the routing metals of the chips;
the electric resistances induced in the final assembly having the high electron mobility transistor integrated therein.

To overcome this problem, it is possible to significantly decrease the resistivity Ron of a high electron mobility transistor by increasing the surface area thereof. There however exist situations for which the space available for the integration of a high electronic mobility transistor is constrained so that such a solution cannot be envisaged.

As a variant, it may be envisaged to optimize the parameters influencing resistivity Ron. Such a solution however remains complex to implement, since it requires, on the one hand, a full resizing of the high electron mobility transistor, and on the other hand a reviewing of the method enabling to manufacture said transistor.

The present disclosure provides a device having its arrangement allowing a greater density of integration of high electron mobility transistors without however significantly increasing the space occupied by said device.

The present disclosure also provides a device allowing an efficient management of inrush currents.

It should be appreciated that the disclosure is not limited to the described embodiments and alternative embodiments may be brought thereto without departing from the framework of the disclosure.

Further, it should be understood that the different drawings shown in relation with the present description are given as an illustration only and by no way limit the disclosure. It should particularly be clear that the relative scales or dimensions may not be respected.

All throughout the description, it is admitted that a layer or an interface is generally planar and extends along a plane parallel to the (0, x, y) plane of the (0, x, y, z) orthonormal reference frame. Further, as soon as reference is made to a representation along a cross-section plane, the latter is perpendicular to all the planes formed by the layers, and in some implementations perpendicular to the (0, x, y) plane. It should also be understood that, as soon as reference is made to a stack of layers, the latter are stacked along the z direction of the (0, x, y, z) orthonormal reference frame.

The disclosure includes an electronic device comprising a HEMT transistor, referred to herein as "main transistor" for descriptive purposes, and at least another HEMT transistor, referred herein as "additional transistor" for descriptive purposes.

The main transistor and the additional transistor are respectively provided with a main stack and with an additional stack having an insulating layer interposed therebetween.

The main stack and the additional stack extend from the insulating layer to, respectively, a back side and a front side of the electronic device, and each comprise, from the insulating layer, a barrier layer and a channel layer.

For example, as soon as it switches from a non-conductive state to a conductive state, the considered HEMT is capable of forming, in the channel layer, a conduction layer. In some implementations, this conduction layer takes the form of a two-dimensional electron gas, and extends in the channel layer from the interface formed between the barrier layer and the channel layer.

The main transistor and the additional transistor comprise a common drain electrode and, respectively, a main source electrode and an additional source electrode, arranged so that electric conduction paths likely to be formed by the two conduction layers are connected in parallel when one and the other of the HEMT transistors are in the conductive state.

The switching from one of the non-conductive state and of the conductive state to the other of these two states is controlled independently for one and the other of the main transistor and of the additional transistor via, respectively, a main gate electrode and an additional gate electrode.

This configuration is advantageous in several respects. Indeed, the parallelizing of the conduction channels of the two transistors enables to increase the intensity of the current likely to flow through the electronic device without having to increase its surface area. In some implementations, when the current flowing through the main transistor exceeds a threshold voltage, it is possible to make the additional transistor conductive to form a conduction layer in said transistor connected in parallel with the conduction layer of the additional transistor.

Further, this parallelizing also enables to decrease the on-state resistivity Ron of the electronic device.

Figure 2A:
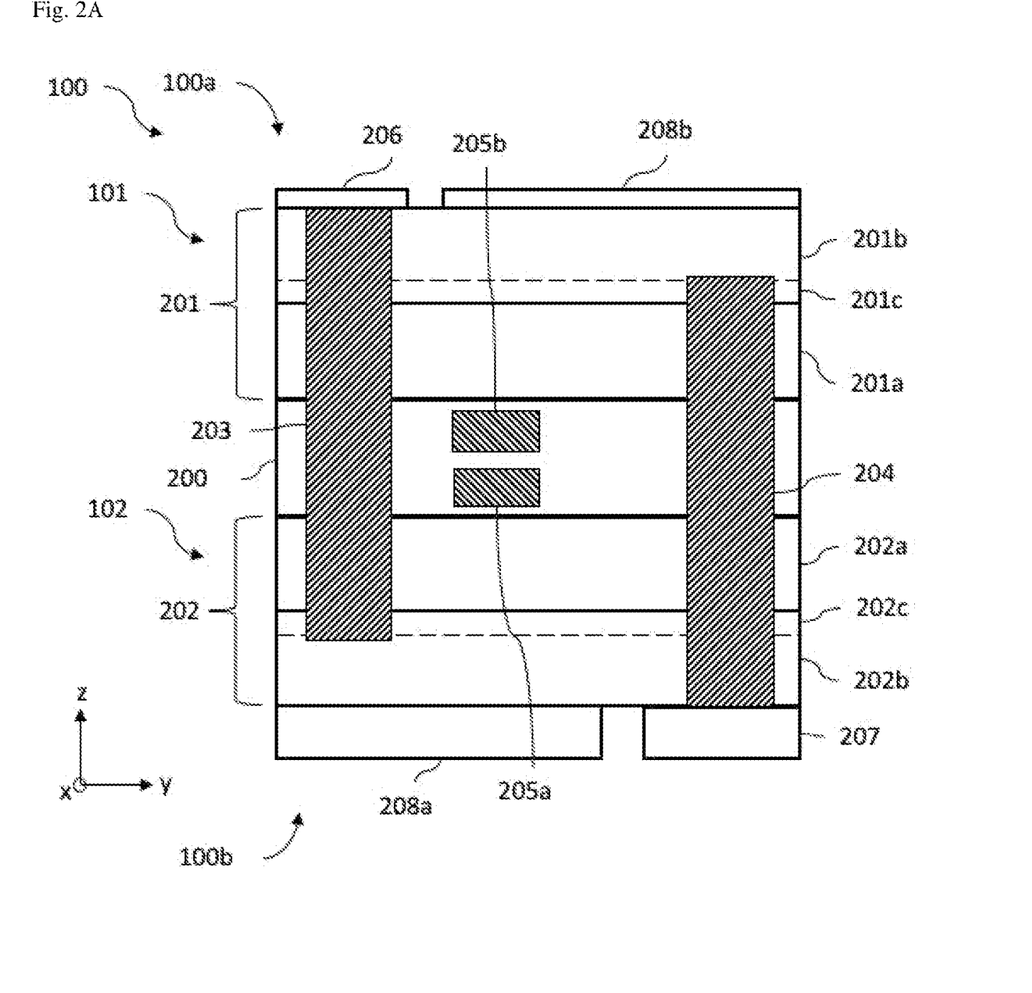
FIG. 2A is a simplified representation of an electronic device, along a cross-section plane, according to the first embodiment of the present disclosure.
Figure 2B:
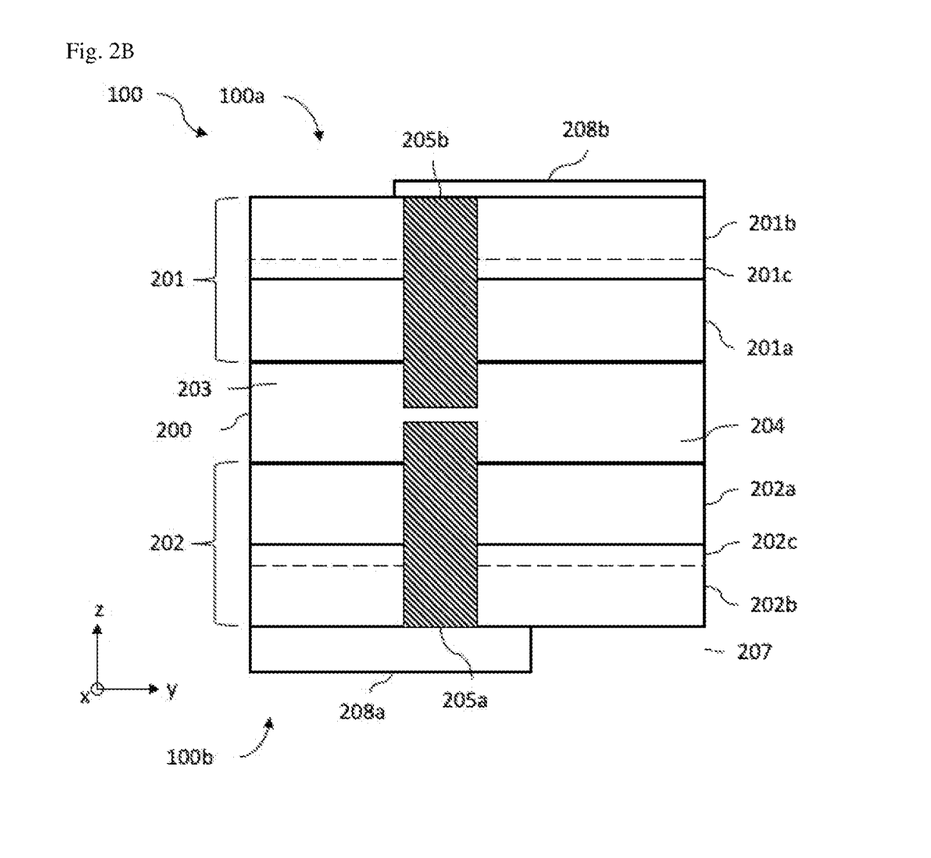
Figure 2C:
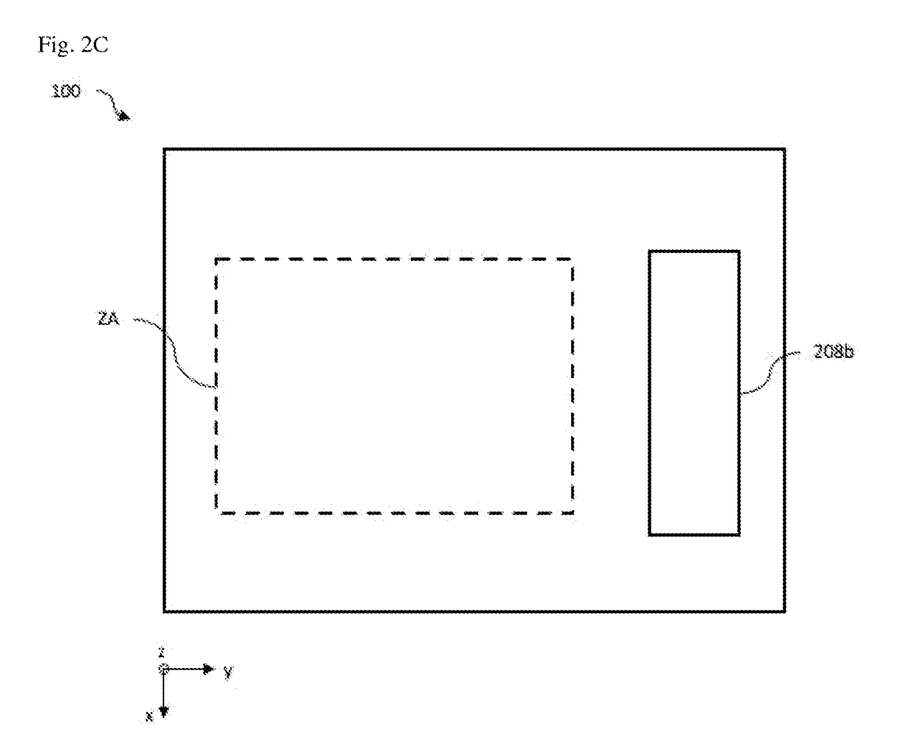
FIG. 2C is a representation illustrating the offset positioning of an additional gate pad enabling to electrically connect the additional gate electrode of the electronic device of FIG. 2a in a front view of said device.

FIGS. 2A-2C show an example of an electronic device 100 according to a first embodiment of the present disclosure.

Thus, the electronic device 100 according to the present disclosure comprises high electron mobility transistors (hereafter, "HEMT transistors"). In some implementations, electronic device 100 comprises, from a front side 100a to a back side 100b, at least one additional transistor 101 and one main transistor 102 separated by an insulating layer 200. Insulating layer 200 in some implementations comprises silicon dioxide or silicon nitride.

According to this embodiment, the HEMT transistors are in enhancement mode. In other words, such a transistor exhibits a positive threshold voltage Vth (such a transistor is thus conductive when the potential difference Vg–VS applied between the gate electrode and the source electrode is greater than Vth).

The description of the present disclosure will use the implementation of a single additional transistor as an illustrative example. However, this aspect is not such as to limit the scope of the present disclosure. In some implementations, it will be within the abilities of those skilled in the art, based on their general knowledge and on the description herein, to implement, within the framework of the present disclosure, a plurality of additional transistors.

First transistor 101 and second transistor 102 each comprise a stack respectively called first stack 201 and second stack 202. Each of these stacks may in some implementations comprise group-III-V semiconductor materials, and in some implementations group-III-N semiconductor materials. The group-III-V semiconductor materials may in some implementations be selected from among gallium nitride (GaN), aluminum nitride (AlN), and their $Al_xGa_{1-x}N$ ternary alloys, or from among gallium arsenide (GaAs) and its compounds (AlGaAs, InGaAs).

Additional stack 201 and main stack 202 each comprise a barrier layer and a channel layer. In some implementations, additional stack 201 comprises, from insulating layer 200 to front side 100a, an additional barrier layer 201a and an additional channel layer 201b. Equivalently, main stack 202 comprises, from insulating layer 200 to back side 100b, a main barrier layer 202a and a main channel layer 202b.

As an example and according to the present disclosure, a barrier layer may comprise an $Al_xGa_{1-x}N$ ternary alloy while a channel layer may comprise GaN.

Further, a barrier layer may have a thickness in the range from 1 nm to 100 nm.

A channel layer may have a thickness in the range from 10 nm to 2 µm.

A stack 201 or 202, according to the terms of the present disclosure, is capable of forming a two-dimensional electron gas layer (2DEG) which forms a conduction layer.

The conduction layer, within a stack, extends in the channel layer, from the interface formed between the barrier layer and the channel layer of the considered stack.

Thus, additional stack 201 comprises an additional conduction layer 201c which extends in additional channel layer 201b, from an additional interface formed between additional barrier layer 201a and additional channel layer 201b.

Equivalently, main stack 202 comprises a main conduction layer 202c which extends in main channel layer 202b, from a main interface formed between main barrier layer 202a and main channel layer 202b.

Electronic device 100 comprises a source electrode 203 and a drain electrode 204 in electric contact with one and the other of additional conduction layer 201c and of main conduction layer 202c. It should be reminded that different types of electric contacts are known to electrically connect the source 203 and drain 204 electrodes to a conduction layer 201c, 202c: in some implementations, ohmic, tunnel, or Schottky contacts.

In some implementations, source electrode 203 and drain electrode 204 cross insulating layer 200, and each extend on either side of said insulating layer 200 to, each, electrically contact additional conduction layer 201c and main conduction layer 220c.

Electric device 100 may comprise a pad, called source pad 206, arranged on front side 100a and enabling to electrically contact source electrode 203. Source pad 206 in some implementations comprises doped silicon.

Electric device 100 may comprise a pad, called drain pad 207, arranged on back side 100b and enabling to electrically contact drain electrode 204. Drain pad 207 may in some implementations comprise doped silicon.

The conduction layer of a HEMT transistor, when the latter is conductive, is intended to ensure the conduction of an electric current between the source electrode and the drain electrode of the considered HEMT transistor.

The electronic device 100 according to the present disclosure also comprises two gate electrodes distinct from each other (that is: electrically insulated from each other). In some implementations, electronic device 100 comprises a main gate electrode 205a and an additional gate electrode 205b.

Electric device 100 may comprise a pad, called main gate pad 208a, arranged on the back side and enabling to electrically contact the main gate electrode.

Equivalently, electric device 100 may comprise a pad, called additional gate pad 208b, arranged on the front side and enabling to electrically contact the additional gate electrode.

It should be understood that, for each HEMT transistor, the electric contact between a gate electrode and the gate pad which is associated therewith is offset to avoid risking electrically contacting the conduction layer of the considered transistor. In some implementations, the main gate pad and the additional gate pad are offset from an active area of the electronic device (FIG. 2B). "Offset" designates a gate pad which is arranged outside of a contour delimiting one and the other of the two transistors. In this regard, FIG. 2C is a representation of device 100 in front view (along a plane parallel to the (0, x, y) plane). The dotted lines delimit an active section ZA of the electronic device within which any contact between the gate electrode and one and the other of the barrier and channel layers is avoided.

Thus, main gate electrode 205a is arranged to control main transistor 102, and in some implementations control the switching from one of the non-conductive state and of the conductive state to the other one of these two states.

Equivalently, additional gate electrode 205b is arranged to control additional transistor 101, and in some implementations control the switching from one of the non-conductive state and of the conductive state to the other one of these two states.

"Conductive state" designates a transistor where a current is likely to flow between the source electrode and the drain electrode. In some implementations, a HEMT transistor, when it is in the conductive state, comprises a conduction layer such as defined herein.

"Non-conductive state" designates a transistor which behaves as an off switch so that no current can flow between its source electrode and the drain electrode.

In some implementations, a HEMT transistor switches from a non-conductive state to a conductive state as soon as the potential difference $V_g - V_s$ between the gate electrode and the source electrode is greater than the threshold voltage $V_{th}$ of the considered transistor.

Thus, according to the present disclosure, main transistor 102 and additional transistor 101 may be controlled independently. In some implementations, the main transistor and the additional transistor may be, depending on the voltage applied to their gate electrode, in the same state or in a different state.

For example, as soon as a current is to be conducted through electronic device 100, it is possible to first control the switching from the non-conductive state to the conductive state of the main transistor while keeping the additional transistor in the non-conductive state. These conductive and non-conductive states, respectively, of the main transistor and of the additional transistor may be kept as long as the current remains smaller than a threshold current value Is.

Threshold current value Is may be smaller than or equal to a damage current value Id. The value of degradation current Id corresponds to a current value beyond which the main transistor risks being damaged.

As an example, the value of threshold current Is may be smaller than half the value of damage current Id.

Thus, the implementation of additional transistor 101 enables to protect the main transistor, in some implementations, on occurrence of inrush currents.

As a variant or as a complement, additional transistor 101 may be implemented as soon as the main transistor opposes too high a resistance Ron to the passage of current through its conduction layer. Such an effect may in some implementations occur when the temperature of the electronic device increases.

Still as a variant, additional transistor 101 may be implemented to absorb a current peak likely to occur in the main transistor at the switching from the non-conductive state to the conductive state thereof. For this purpose, the switching to the conductive state of the additional transistor concurrent to the switching to the conductive state of the main transistor enables to overcome the occurrence of a current peak.

Figure 3:
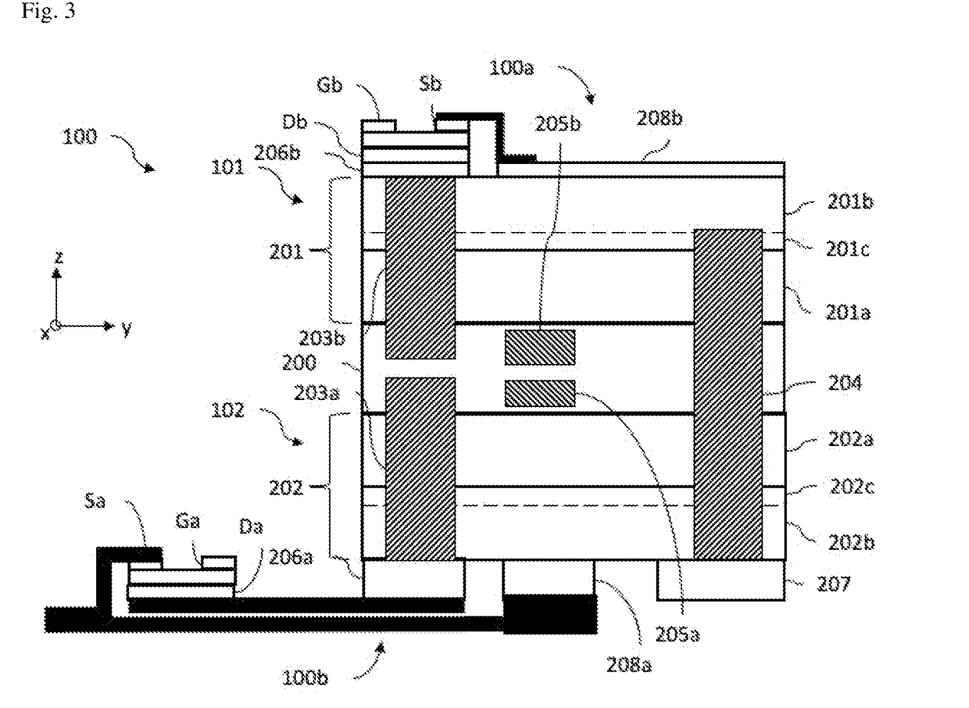
FIG. 3 is a simplified representation of an electronic device, along a cross-section plane, according to the second embodiment of the present disclosure.

FIG. 3 shows an electronic device 100 according to an embodiment of the present disclosure. This embodiment has most of the features described in relation with FIGS. 2A-2C.

According to this second embodiment, the HEMT transistors are in depletion or normally-on mode. In other words, such a transistor has a threshold voltage $V_{th}$ smaller than 0. Such a transistor is thus conductive when the potential difference applied between the gate electrode and the source electrode is zero.

According to this second embodiment, main transistor 102 and the additional transistor no longer share the same source electrode.

In some implementations, main transistor 102 comprises a source electrode, called main source electrode 203a, which crosses main stack 202 and emerges through back side 100b. The electronic device comprises in this respect a pad, called main source pad 206a, arranged on back side 100b and enabling to establish an electric contact with main source electrode 203a.

Equivalently, additional transistor 101 comprises a source electrode, called additional source electrode 203b, which crosses additional stack 201, and emerges through front side 100a. The electronic device comprises in this respect a pad, called additional source pad 206b, arranged on front side 100b and enabling to establish an electric contact with additional source electrode 203b.

According to this second embodiment, the main transistor and the additional transistor are each coupled in cascade (or cascaded) with a MOSFET transistor.

In some implementations, main transistor 102 is cascoded, by its source, with a MOSFET transistor called main MOSFET transistor. The latter comprises a source Sa connected to main gate electrode 205a, a drain Da connected to main source electrode 203a, and a gate Ga enabling to control the switching from a conductive state to a non-conductive state, or conversely, of the main MOSFET.

Equivalently, additional transistor 101 is cascoded, by its source, with a MOSFET transistor called additional MOSFET transistor. The latter comprises a source Sb connected to additional gate electrode 205b, a drain Db connected to additional source electrode 203b, and a gate Gb enabling to control the switching from a conductive state to a non-conductive state, or conversely, of the additional MOSFET transistor.

Also, still according to this second embodiment, sources Sa and Sb are also electrically connected.

According to this second embodiment, the main gate electrode and the additional gate electrode are controlled by, respectively, gate Ga and gate Gb.

The operation of the electronic device according to this second embodiment is similar to that discussed in the context of the first embodiment.

Figure 4:
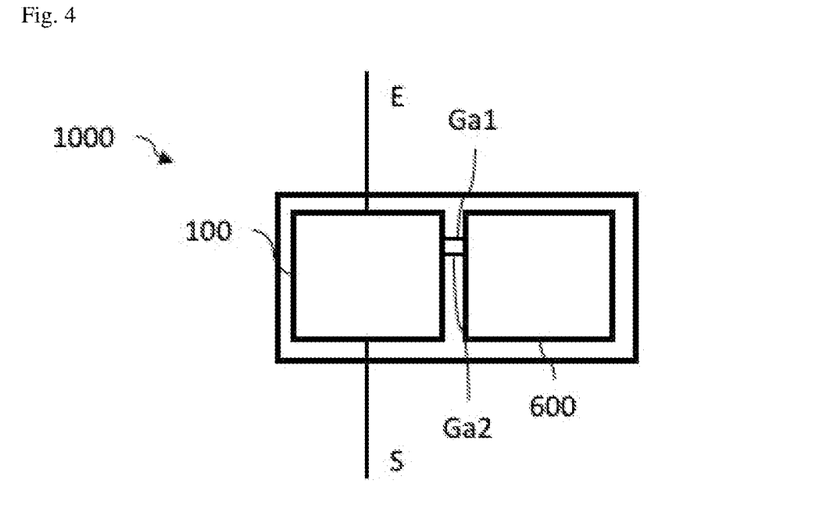
FIG. 4 is a functional representation of a package implementing the electronic device according to the first embodiment of the present disclosure.

Whatever the envisaged embodiment, the electronic device according to the present disclosure may be integrated to an electronic package 1000 provided with control means 600 (FIG. 4). The electronic package in some implementations comprises an input E and an output S connected, respectively, to the source electrode and to the drain electrode.

Control means 600 are in some implementations configured to control the switching from one of the non-conductive state and of the conductive state to the other one of these two states, of the main transistor and of the additional transistor. In some implementations, the control means are connected to electronic device 100 via a connection Ga1 and a connection Ga2 intended to impose a voltage, respectively, to the main gate electrode and to the additional gate electrode.

In some implementations, control means 600 are configured to make the additional transistor conductive as soon as the main transistor is itself in the conductive state and as the current that it conducts is greater than threshold value Is.

In some implementations, control means 600 may be configured to synchronize the main gate electrode and the additional gate electrode to limit current peaks likely to appear at the switching to the conductive state of these two transistors.

The present disclosure also concerns a method of manufacturing the above-described electronic device 100. The manufacturing method is only described in the context of the forming of the electronic device 100 according to the first embodiment. Those skilled in the art may, based on their general knowledge and on the concepts discussed hereafter, adapt the method to implement it in the context of the second embodiment.

Figure 5:
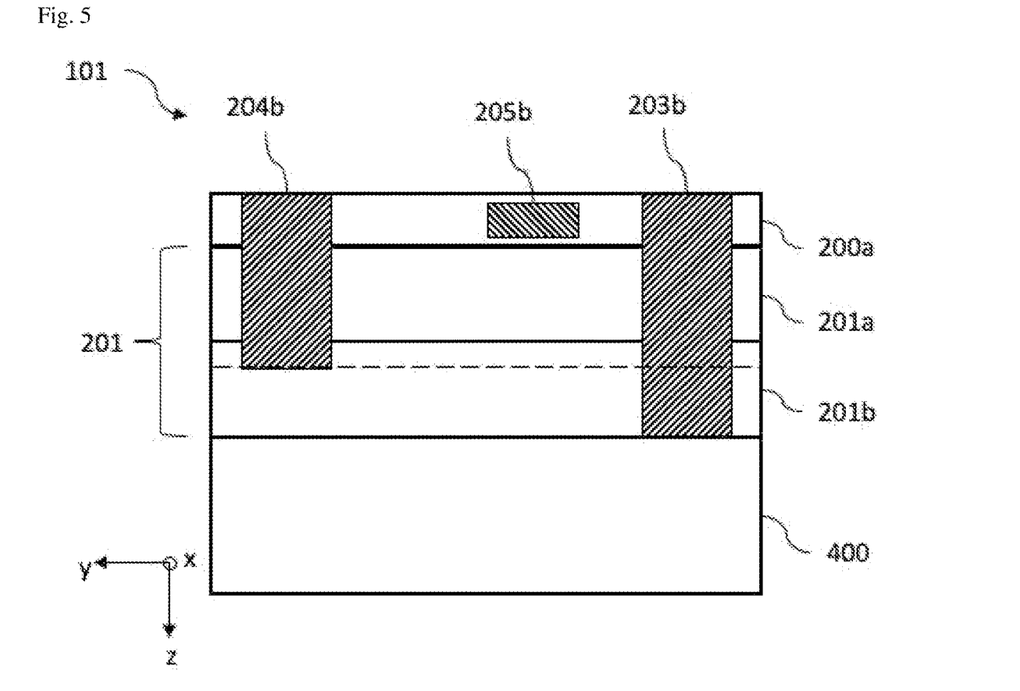
FIG. 5 is a simplified representation of a step of forming an additional transistor according to the terms of the present disclosure.

In some implementations, the method comprises a step of forming an additional transistor 101 (FIG. 5).

In some implementations, the forming of this additional transistor 101 comprises an epitaxial growth of additional stack 201 on a first surface of a first substrate 400, for example, a silicon substrate. The epitaxial growth may in some implementations first comprise the forming of additional channel layer 201b, and then the forming of additional barrier layer 201a. In some implementations, the forming of the additional channel layer may be preceded by the forming of an additional matching layer (on which the additional channel layer must rest). The additional matching layer is in some implementations intended to limit the forming of dislocations in the additional channel layer.

The epitaxial growth is followed by the forming, over additional barrier layer 201a, of a first insulating layer 200a, which for example comprises silicon dioxide or silicon nitride.

The deposition of insulating layer 200a is then followed by the forming of a first source electrode 203b, of a first drain electrode 204b, and of a first gate electrode 205b. The two electrodes 203b and 204b in some implementations extend from a free surface of the first insulating layer towards or into additional stack 201.

Figure 6:
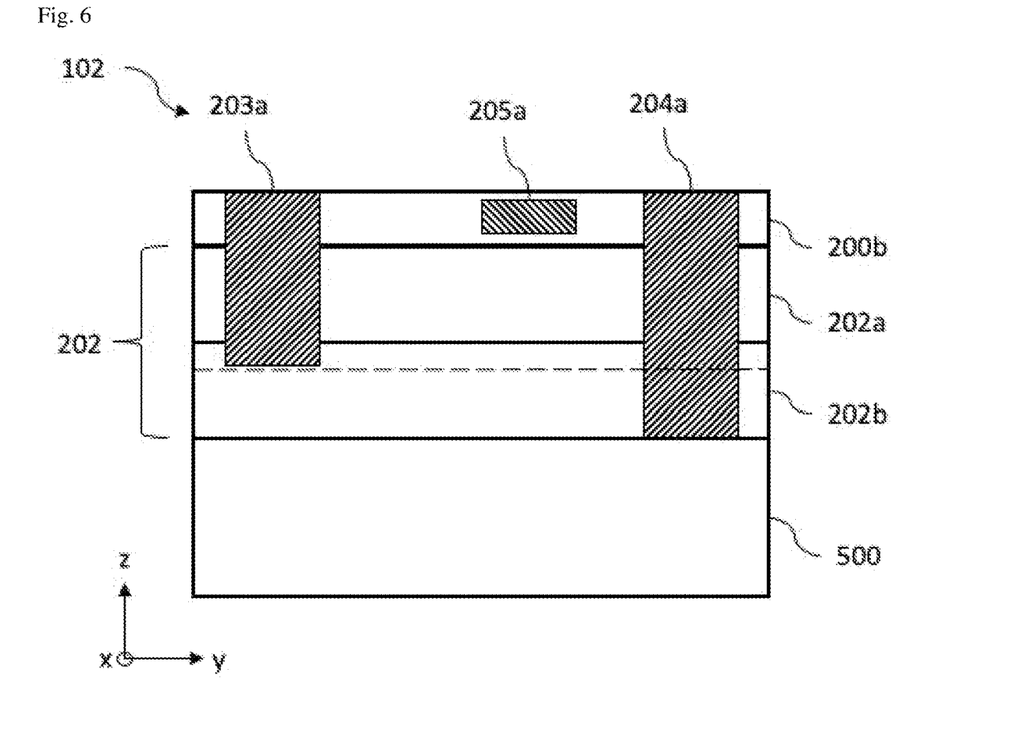
FIG. 6 is a simplified representation of a step of forming a main transistor according to the terms of the present disclosure.

The manufacturing method comprises a step of forming a main transistor 102 (FIG. 6).

In some implementations, the forming of this main transistor 102 comprises an epitaxial growth of main stack 202 on a first surface of a second substrate 500, for example a silicon substrate. The epitaxial growth may in some implementations first comprise the forming of main channel layer 202b, and then the forming of main barrier layer 202a. In some implementations, the forming of the main channel layer may be preceded by the forming of a main matching layer (on which the main channel layer must rest). The main matching layer is in some implementations intended to limit the forming of dislocations in the main channel layer.

The epitaxial growth is followed by the forming, over main barrier layer 202a, of a second insulating layer 200b, which for example comprises silicon dioxide.

The deposition of second insulating layer 200b is then followed by the forming of a second source electrode 203a, of a second drain electrode 204a, and of a second gate electrode 205a.

The manufacturing method also comprises a step of assembly of additional transistor 101 and of main transistor 102. In this respect, the assembly step is executed by placing into contact first insulating layer 200a with second insulating layer 200b, and so that first source electrode 203b and first drain electrode 204b are in line with, respectively, second source electrode 203a and second drain electrode 204a.

In other words, the assembly of the first insulating layer with the second insulating layer forms insulating layer 200. The assembly of first source electrode 203b with second source electrode 203a forms source electrode 203. The assembly of first drain electrode 204b with second drain electrode 204a forms drain electrode 204. First gate electrode 205b and second gate electrode 205a remain independent from each other.

It should further be noted that this assembly step may be performed according to a plate-to-plate mode. In some implementations, the method may comprise the forming of a plurality of first transistors formed on the first substrate, and a plurality of main transistors formed on the second substrate. These two substrates are then assembled to place each additional transistor opposite a main transistor.

As a variant, the assembly may comprise a pick-and-place step. In some implementations, each additional transistor may be individually placed on each main transistor formed on the second substrate.

Finally, and still as a variant, the main transistors and the additional transistors are all singularized, and then assembled two by two.

Figure 7:
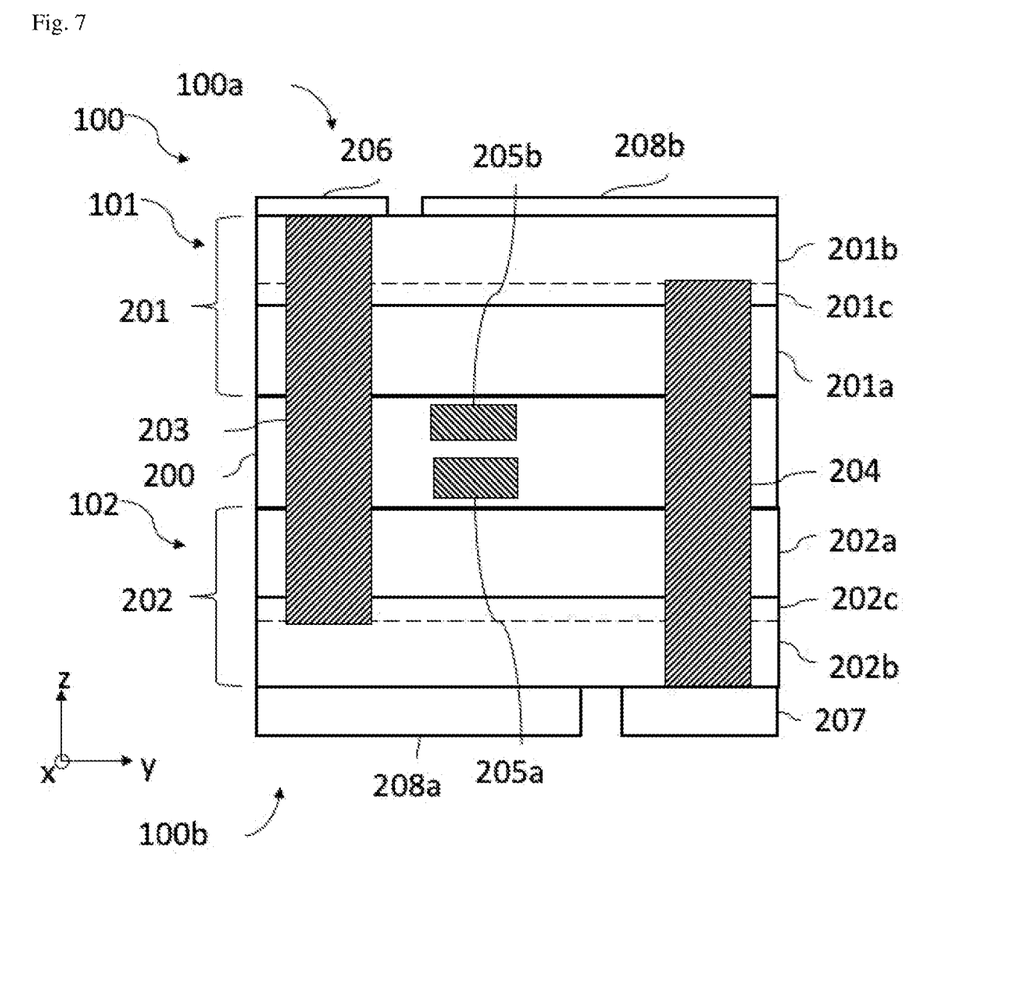
FIG. 7 is a simplified representation of a step of forming pads intended to electrically contact the source and gate electrodes.

In a last step, the source and gate pads are formed by thinning and etching of the first substrate (FIG. 7).

The electronic device according to the present disclosure is in some implementations implemented in an electric power management/consumption system.

In some implementations, the management system may comprise power storage means and path of consumption of said power. The storage means for example are a battery or an accumulator.

The consumption path may be an electric motor. Thus, the electronic device 100 according to the present disclosure is in some implementations implemented in an electric vehicle (car, truck, bicycle, train).

Electronic device may be summarized as including a HEMT transistor, called main transistor, and at least another HEMT transistor, called additional transistor, the main transistor and the additional transistor being provided, respectively, with a main stack and with an additional stack having an insulating layer interposed therebetween, the main stack and the additional stack extending, from the insulating layer towards, respectively, a back side and a front side of the electronic device, and each including, from the insulating layer, a barrier layer and a channel layer which, when the considered HEMT transistor switches from a non-conductive state to a conductive state, is capable of forming a conduction layer, the main transistor and the additional transistor including a common drain electrode and, respectively, a main source electrode and an additional source electrode, arranged so that electric conduction paths likely to be formed by the two conduction layers are connected in parallel when one and the other of the HEMT transistors are in the conductive state, the switching from one of the non-conductive state and of the conductive state to the other one of these two states being controlled independently for one and the other of the main transistor and of the additional transistor via, respectively, a main gate electrode and an additional gate electrode.

The drain electrode may cross the insulating layer and may extend on either side of said insulating layer to electrically contact the channel layer of one and the other of the main transistor and of the additional transistor, in some implementations, the electronic device may include a pad, called drain pad, arranged on the back side and enabling to electrically contact the drain electrode.

Said electric device may include a pad, called main gate pad, arranged on the back side and enabling to electrically contact the main gate electrode and a pad, called additional gate pad, arranged on the front side and enabling to electrically contact the additional gate electrode.

The main transistor and the additional transistor may be enhancement-mode HEMT transistors, and the main source electrode and the additional source electrode may form a single source electrode, in some implementations, the source electrode crosses the insulating layer, and extends on either side of said insulating layer to electrically contact the channel source of one and the other of the main transistor and of the additional transistor.

Said electronic device may include a pad called source pad enabling to electrically contact the source electrode.

The source pad may be arranged on the front side.

The main transistor and the additional transistor may be depletion-mode HEMT transistors, and may be each cascoded with a MOSFET transistor respectively called main MOSFET transistor and additional MOSFET transistor.

The main MOSFET transistor and the additional MOSFET transistor may be arranged to independently impose a conductive state or a non-conductive state, respectively, to the main transistor and to the additional transistor.

Said electronic device may further include two pads called main source pad and additional source pad enabling to electrically contact, respectively, the main source electrode and the additional source electrode, the main source pad and the additional source pad being arranged, respectively, on the back side and on the front side.

The main stack and the additional stack may be essentially identical.

The main transistor and the additional transistor may have an identical threshold voltage.

The main transistor and the additional transistor each may have, respectively, a main threshold voltage and an additional threshold voltage different from each other.

The two channel layers may include GaN and the barrier layers may include an AlGaN ternary alloy.

The insulating layer may include a dielectric material, in some implementations, silicon dioxide.

Electronic package may be summarized as including the electronic device discussed herein; means for controlling the switching from one of the non-conductive state and of the conductive state to the other one of these two states, of the main transistor and of the additional transistor, the control means being configured to make the additional transistor conductive as soon as the main transistor is itself in the conductive state and the current that it conducts is greater than a threshold value.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a first high electron mobility transistors (HEMT) transistor; and
   at least one second HEMT transistor,
   wherein the first HEMT transistor includes a first stack of layers and the second HEMT transistor includes a second stack of layers, an insulating layer interposed between the first stack of layers and the second stack of layers, the first stack of layers and the second stack of layers extending, from the insulating layer towards, respectively, a first side and a second side of the electronic device;
   wherein each of the first stack of layers and the second stack of layer includes a barrier layer and a channel layer arranged in order from the insulating layer;
   wherein the first HEMT transistor includes a first source electrode and a first gate electrode, the second HEMT transistor includes a second source electrode distinct from the first source electrode and separated from the first source electrode by a first portion of the insulating layer and a second gate electrode distinct from the first gate electrode and separated from the first gate electrode by a second portion of the insulating layer, and the first HEMT transistor and the second HEMT transistor include a common drain electrode; and
   wherein the common drain electrode crosses the insulating layer and extends on either side of the insulating layer and is in contact with the channel layer of the first HEMT transistor and in contact with the channel layer of the second HEMT transistor.

2. The device according to claim 1, wherein the electronic device further comprises a drain pad, arranged on the first side and in contact with the drain electrode.

3. The device according to claim 1, further comprising:
a first gate pad, arranged on the first side and in contact with the first gate electrode; and
a second gate pad, arranged on the second side and in contact with the second gate electrode.

4. The device according to claim 1, wherein the first HEMT transistor and the second HEMT transistor are enhancement-mode HEMT transistors.

5. The device according to claim 4, further comprising a source pad in contact with the source electrode.

6. The device according to claim 5, wherein the source pad is arranged on the second side.

7. The device according to claim 1, further comprising a first MOSFET transistor and a second MOSFET transistor,
wherein the first HEMT transistor and the second HEMT transistor are depletion-mode HEMT transistors, and are each coupled in cascode with the first MOSFET transistor and the second MOSFET transistor, respectively.

8. The device according to claim 7, wherein the first MOSFET transistor and the second MOSFET transistor are configured to independently impose a conductive state or a non-conductive state, respectively, to the first HEMT transistor and to the second HEMT transistor.

9. The device according to claim 1, further comprising a first source pad and a second source pad in contact with, respectively, the first source electrode and the second source electrode, the first source pad and the second source pad being arranged, respectively, on the first side and on the second side.

10. The device according to claim 1, wherein the first stack of layers and the second stack of layers mirror one another.

11. The device according to claim 1, wherein the first HEMT transistor and the second HEMT transistor have a same threshold voltage.

12. The device according to claim 1, wherein the first HEMT transistor has a first threshold voltage and the second HEMT transistor has a second threshold voltage different from the first threshold voltage.

13. The device according to claim 1, wherein channel layers of the first HEMT transistor and the second HEMT transistor include GaN, and barrier layers of the first HEMT transistor and the second HEMT transistor include an AlGaN ternary alloy.

14. The device according to claim 1, wherein the insulating layer includes silicon dioxide.

15. An electronic package, comprising:
a first HEMT transistor;
a second HEMT transistor; and
a control circuitry,
wherein the first HEMT transistor includes a first stack of layers extending from an insulating layer towards a first direction, and the second HEMT transistor includes a second stack of layers extending from the insulating layer towards a second direction opposite the first direction;
wherein each of the first stack of layers and the second stack of layer includes a barrier layer and a channel layer arranged in order from the insulating layer;
wherein the first HEMT transistor includes a first source electrode and a first gate electrode, the second HEMT transistor includes a second source electrode separated from the first source electrode by a first portion of the insulating layer and a second gate electrode separated from the first gate electrode by a second portion of the insulating layer, and the first HEMT transistor and the second HEMT transistor include a common drain electrode, the first gate electrode being in the insulating layer and between the first source electrode and the common drain electrode; and
wherein the control circuitry is configured to control the second HEMT transistor to switch to a conductive state as soon as the first HEMT transistor is in a conductive state and a current that the first HEMT transistor conducts is greater than a threshold value.

16. The package according to claim 15, wherein the control circuitry controls the first and second HEMT transistors to separately switch between a non-conductive state and a conductive state via the first gate electrode and the second gate electrode, respectively.

17. The package according to claim 16, wherein electric conduction paths in the channel layers of the first and second HEMT transistors are connected in parallel when the first and second HEMT transistors are in conductive state.

18. An electronic device comprising:
an insulating layer,
a first stack of layers extending from the insulating layer towards a first direction, the first stack of layers including a first barrier layer and a first channel layer;
a second stack of layers extending from the insulating layer towards a second direction opposite to the first direction, the second stack of layers including a second barrier layer and a second channel layer;
a common drain electrode in contact with both the first channel layer and the second channel layer, the common drain electrode having a first end with a first surface on a drain pad and a second end opposite the first end with a second surface in contact with the first channel layer; and
a first gate electrode adjacent to the insulating layer and between a source electrode and the common drain electrode.

19. The device according to claim 18, comprising:
the source electrode extending from the first channel layer toward the insulating layer, the source electrode in contact with the first channel layer.

20. The device according to claim 19, wherein the source electrode extends from a side of the first stack of layers and terminates before extending over a full thickness of the second channel layer; and
wherein the common drain electrode extends from a side of the second stack of layers and terminates before extending over a full thickness of the first channel layer.

* * * * *